(12) United States Patent
Sui et al.

(10) Patent No.: US 11,419,238 B2
(45) Date of Patent: Aug. 16, 2022

(54) WIRELESS CHARGING DEVICE

(71) Applicant: HUAWEI TECHNOLOGIES CO., LTD., Guangdong (CN)

(72) Inventors: Jiajia Sui, Shanghai (CN); Quanming Li, Dongguan (CN); Guo Yang, Minsk (BY); Shuainan Lin, Shenzhen (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 0 days.

(21) Appl. No.: 16/759,890

(22) PCT Filed: Oct. 27, 2018

(86) PCT No.: PCT/CN2018/112256
§ 371 (c)(1),
(2) Date: Apr. 28, 2020

(87) PCT Pub. No.: WO2019/085839
PCT Pub. Date: May 9, 2019

(65) Prior Publication Data
US 2021/0185854 A1  Jun. 17, 2021

(30) Foreign Application Priority Data

Oct. 30, 2017  (CN) .......................... 201711035158.2

(51) Int. Cl.
*H05K 7/20* (2006.01)
*H02J 50/00* (2016.01)
(Continued)

(52) U.S. Cl.
CPC ....... *H05K 7/20145* (2013.01); *H01F 27/085* (2013.01); *H02J 7/0042* (2013.01);
(Continued)

(58) Field of Classification Search
CPC .......... H05K 7/20145; H05K 7/20172; H05K 7/20909; H02J 50/12; H02J 50/005; H02J 7/0042; H01F 27/085
(Continued)

(56) References Cited

U.S. PATENT DOCUMENTS 6,049,191 A * 4/2000 Terazoe ................. B60L 53/12
320/108
9,887,555 B2 * 2/2018 Sultenfuss ............. H02J 5/005
(Continued)

FOREIGN PATENT DOCUMENTS

CN  202424237 U  9/2012
CN  203434660 U  2/2014
(Continued)

OTHER PUBLICATIONS

Office Action dated Sep. 12, 2019, issued in counterpart CN Application No. 201711035158.2, with English Translation. (15 pages).
(Continued)

*Primary Examiner* — Anatoly Vortman
(74) *Attorney, Agent, or Firm* — WHDA, LLP (57) ABSTRACT

Embodiments of the present invention relate to a wireless charging device. The wireless charging device includes a housing, an induction coil, a ferrite, a printed circuit board (PCB), and a fan. The housing includes a first surface and a second surface, a protrusion is disposed on the first surface, and the protrusion is configured to: support a to-be-charged device, and leave a gap between the to-be-charged device and the first surface when the to-be-charged device is installed on the wireless charging device. At least one first air guiding opening and at least one second air guiding opening are disposed on the housing. When the fan runs, the first air guiding opening, the fan, and the second air guiding (Continued)

opening form an air duct that passes through the ferrite and the PCB.

9 Claims, 4 Drawing Sheets

(51) Int. Cl.
   *H02J 50/12*   (2016.01)
   *H02J 7/00*   (2006.01)
   *H01F 27/08*   (2006.01)
(52) U.S. Cl.
   CPC ............ *H02J 50/005* (2020.01); *H02J 50/12* (2016.02); *H05K 7/20172* (2013.01); *H05K 7/20909* (2013.01)
(58) Field of Classification Search
   USPC .......................................................... 361/695
   See application file for complete search history.

(56) References Cited

U.S. PATENT DOCUMENTS

| | | | | |
|---|---|---|---|---|
| 9,973,027 | B2* | 5/2018 | Sultenfuss | H01F 38/14 |
| 10,270,276 | B2* | 4/2019 | Kim | H02J 50/005 |
| 10,938,239 | B2* | 3/2021 | Kim | H02J 50/005 |
| 2008/0079388 | A1* | 4/2008 | Sarnowsky | H02J 7/025 |
| | | | | 320/103 |
| 2014/0007594 | A1* | 1/2014 | Lofy | H02J 7/025 |
| | | | | 62/3.2 |
| 2016/0181849 | A1* | 6/2016 | Govindaraj | H02J 7/025 |
| | | | | 320/108 |
| 2017/0018947 | A1 | 1/2017 | Chien et al. | |
| 2017/0047764 | A1* | 2/2017 | Lee | H02J 7/0021 |
| 2017/0047769 | A1* | 2/2017 | Kim | H02J 50/005 |
| 2017/0274778 | A1 | 9/2017 | Van Boheemen et al. | |
| 2018/0224909 | A1* | 8/2018 | Koo | G06F 1/203 |
| 2019/0215984 | A1* | 7/2019 | Pinkos | H02J 7/025 |

FOREIGN PATENT DOCUMENTS

| | | |
|---|---|---|
| CN | 203574404 U | 4/2014 |
| CN | 103997083 A | 8/2014 |
| CN | 204012835 U | 12/2014 |
| CN | 204144989 U | 2/2015 |
| CN | 205265745 U | 5/2016 |
| CN | 205385351 U | 7/2016 |
| CN | 105827020 A | 8/2016 |
| CN | 105846496 A | 8/2016 |
| CN | 205670722 U | 11/2016 |
| CN | 205724951 U | 11/2016 |
| CN | 205829315 U | 12/2016 |
| CN | 106655342 A | 5/2017 |
| CN | 206148983 U | 5/2017 |
| CN | 107093919 A | 8/2017 |
| KR | 20140065090 A | 5/2014 |
| KR | 101727465 B1 | 4/2017 |
| WO | 2010026805 A1 | 3/2010 |
| WO | 2017091201 A1 | 6/2017 |

OTHER PUBLICATIONS

International Search Report dated Jan. 15, 2019, issued in counterpart Application No. PCT/CN2018/112256, with English translation. (12 pages).
Extended (Supplementary) European Search Report dated Nov. 12, 2020, issued in counterpart EP Application No. 18873394.3. (8 pages).
Notice of Allowance dated Mar. 16, 2022, issued in counterpart CN Application No. 202010787297.6, with English Translation. (12 pages).

* cited by examiner

WIRELESS CHARGING DEVICE

CROSS-REFERENCE TO RELATED APPLICATIONS

This application is a National Stage of International Application No. PCT/CN2018/112256, filed on Oct. 27, 2018, which claims priority to Chinese Patent Application No. 201711035158.2, filed on Oct. 30, 2017. Both of the aforementioned applications are hereby incorporated by reference in their entireties.

TECHNICAL FIELD

The present invention relates to the charging field, and in particular, to a wireless charging device.

BACKGROUND

With development of a charging technology of a mobile phone, wireless charging is becoming a more convenient charging trend. In a wireless charging technology, an induction coil is used to charge. Disadvantages of this charging manner are that electrical energy utilization is low and high heat is generated, resulting in a higher temperature of a housing of a mobile phone during charging. Consequently, usage experience of a user is seriously affected, and in addition, a wireless charging speed is slow.

Generally, during wireless charging, the mobile phone is placed above a wireless charging device, and is closely placed on the wireless charging device, or there is only a small gap. By using the wireless charging device, an area of natural convection heat transfer between the mobile phone and air is reduced. Heat generated by the wireless charging device is transferred to the mobile phone, causing poor heat dissipation of the mobile phone. If heat dissipation is not properly controlled overheating of the mobile phone may have detrimental effects to the user's experience. In addition, when the mobile phone is charged, current-limiting temperature control is usually set. When a specific temperature is reached, charging power is limited to reduce the temperature of the mobile phone. During charging, when the temperature of the mobile phone rises to a current-limiting temperature very fast, the charging power is greatly limited, and consequently, a charging speed is slowed down and a charging time is prolonged. Therefore, the consumer highly anticipated demand for fast charging may have to be compromised to avoid the temperature issue. It needs to be considered how to prolong current-limiting time of the charging, and even charge at rated power without current limiting, so as to improve the wireless charging speed. Heat has become one of the biggest bottlenecks that restrict the wireless charging speed. Therefore, it is especially important to reduce the temperature of the mobile phone during wireless charging.

For a heat dissipation design of an existing wireless charging device, there are three manners. A first manner is a pure natural heat dissipation manner, and in this manner, heat of a printed circuit board (PCB) and an induction coil is dissipated through natural convection with an external environment by using a heat dissipation hole on a side of the wireless charging device. In a second manner, a fan is built in the wireless charging device to perform heat dissipation on a ferrite and the induction coil, so that a temperature of a surface of the charging device is reduced, and user experience is improved. In a third manner, a hole is disposed on a front facet of the wireless charging device, and a built-in fan blows to a mobile phone side to reduce a temperature of the mobile phone.

For the foregoing first natural heat dissipation manner, a heat dissipation capability is poor, and consequently the heat of the induction coil and the ferrite inside the wireless charging device is not effectively dissipated. In this case, the heat accumulates locally. The wireless charging device may result in overheating the mobile phone. The foregoing second manner in which the heat is dissipated by using the fan slightly improves on a basis of the first manner. To be specific, the temperature of the surface of the wireless charging device is reduced, however, there is a limitation that only the temperature of the wireless charging device is reduced, but the temperature of the mobile phone cannot be reduced. Current limiting of charging the mobile phone is mainly controlled based on a temperature of a housing of the mobile phone. If the temperature of the mobile phone cannot be reduced, it would be difficult to shorten the charging time due to the limited charginm power and current limiting. For the foregoing third manner, although the temperature of the mobile phone can be reduced, heat of the wireless charging device cannot be effectively dissipated because the hole is disposed on the front facet of the wireless charging device. Because the wireless charging device is relatively close to the mobile phone, a heat dissipation effect on the mobile phone side is affected.

SUMMARY

Embodiments of the present invention provide a wireless charging device, so that heat dissipation effect of a to-be-charged device such as a mobile phone is good.

According to a first aspect, an embodiment of the present invention provides a wireless charging device. The wireless charging device includes a housing, an induction coil, a ferrite, a PCB, and a fan. The induction coil is attached to the ferrite, and the ferrite, the PCB, and the fan are accommodated inside the housing. The housing includes a first surface and a second surface, a protrusion is disposed on the first surface, and the protrusion is configured to: support a to-be-charged device, and leave a gap between the to-be-charged device and the first surface when the to-be-charged device is installed on the wireless charging device. The ferrite is disposed close to the first surface. At least one first air guiding opening and at least one second air guiding opening are disposed on the housing. When the fan runs, the first air guiding opening, the fan, and the second air guiding opening form an air duct that passes through the ferrite and the PCB. The gap forms a part of the air duct, or the gap forms an auxiliary air duct of the air duct.

In this embodiment of the present invention, the fan is disposed inside the housing of the wireless charging device, so that the fan may drive air to flow to generate wind. The protrusion is disposed on the first surface of the wireless charging device, and the protrusion is configured to: support the to-be-charged device, and leave the gap between the to-be-charged device and the first surface when the to-be-charged device is installed on the wireless charging device, so that a channel is provided for the wind to flow through the to-be-charged device and the first surface. The ferrite is disposed close to the first surface, so that heat of the ferrite is dissipated when the wind flows through the first surface. The at least one first air guiding opening and the at least one second air guiding opening are disposed on the housing. When the fan runs, the first air guiding opening, the fan, and the second air guiding opening form the air duct that passes through the ferrite and the PCB, so that a source of heat inside the wireless charging device can be dissipated. The gap forms the part of the air duct, or the gap forms the auxiliary air duct of the air duct, so that heat of the to-be-charged device can also be dissipated.

In a possible implementation, the fan is disposed between the ferrite and the PCB; the first air guiding opening is disposed on the first surface, and the second air guiding opening is disposed on the second surface; and a first part of the gap, the first air guiding opening, the fan, and the second air guiding opening form the air duct, and a second part of the gap forms the auxiliary air duct of the air duct. According to this implementation, the fan is built in the wireless charging device, and the air duct is designed by using an internal structure, so that an airflow can pass through the to-be-charged device side and a device that generates heat and that is inside the charging device. In this way, not only the charging device is cooled, but also the entire to-be-charged device is in a forced convection heat transfer scenario, so that a local hot-spot temperature of a rear cover of the to-be-charged device during wireless charging is reduced. Therefore, thermal performance of the entire device is balanced, a heat dissipation capability of the to-be-charged device is greatly improved, current-limiting charging time is delayed, and a wireless charging speed is improved.

In a possible implementation, the first air guiding opening is an air inlet, and the second air guiding opening is an air outlet; or the second air guiding opening is an air inlet, and the first air guiding opening is an air outlet. According to this implementation, for the to-be-charged device, the wireless charging device may use a forward heat dissipation mode, namely, a suction mode, or may use a reverse heat dissipation mode, namely, a blowing mode. Implementations are flexible and diverse.

In a possible implementation, there is a groove on the first surface, and a hole is disposed on the groove to serve as the first air guiding opening. According to this implementation, the hole is disposed on the groove to serve as the first air guiding opening, so that the suction mode is recommended.

In a possible implementation, the groove is an annular groove, and a hole is disposed on a side surface of the annular groove to form the first air guiding opening. According to this implementation, the hole is disposed on the side surface of the annular groove, so that a waterproof function may be implemented.

In a possible implementation, the fan is an axial flow fan or a centrifugal fan. According to this implementation, a type of the fan may be flexibly selected according to a structure of the air duct and an internal structure of the wireless charging device. For an axial flow fan and a centrifugal fan of a same size, a characteristic of the axial flow fan is a large air volume and a low wind pressure, a characteristic of the centrifugal fan is a small air volume and a high wind pressure, and the centrifugal fan may be made relatively small in thickness.

In a possible implementation, the fan is disposed between the ferrite and the PCB; the wireless charging device further includes a guide plate, and the guide plate is disposed between the first air guiding opening and the fan; the first air guiding opening, the fan, the second air guiding opening, and space surrounded by the guide plate form the air duct; and the gap forms the auxiliary air duct of the air duct. According to this implementation, the air duct is established by using the guide plate, to lead an airflow to the to-be-charged device, so that forced convection heat transfer is directly performed on a part that is of the to-be-charged device and that generates heat heavily; in addition, the guide plate generates a jet effect, so that the to-be-charged device is cooled by air exhausted by the fan, and is affected by a diversion disturbance formed due to a jet differential pressure. In this way, convection heat transfer of another part of the to-be-charged device is enhanced, so that the entire to-be-charged device is in a forced convection heat transfer scenario, and a local hot-spot temperature of the to-be-charged device during wireless charging is reduced. Therefore, the thermal performance of the entire device is balanced, the heat dissipation capability of the to-be-charged device is greatly improved, the current-limiting charging time is delayed, and the wireless charging speed is improved.

In a possible implementation, the second air guiding opening is an air inlet, and the first air guiding opening is an air outlet. According to this implementation, the guide plate generates the jet effect by using the first air guiding opening, so that the to-be-charged device is cooled by the air exhausted by the fan, and is further affected by the diversion disturbance formed due to the jet differential pressure. In this way, the convection heat transfer of the another part of the to-be-charged device is enhanced, so that the entire to-be-charged device is in the forced convection heat transfer scenario.

In a possible implementation, a diameter of the guide plate gradually decreases in a direction from the fan to the first air guiding opening. According to this implementation, by using the gradually narrowed guide plate, an air speed can increase, so that the jet effect is more obvious, and a heat dissipation effect is better.

In a possible implementation, an inclination angle between the guide plate and the first surface is 20° to 40°. According to this implementation, it can be met that air exhausted through the guide plate from the first air guiding opening is directed to the to-be-charged device, and in addition, the jet effect can be more obvious, and the heat dissipation effect can be better.

In a possible implementation, the fan is a centrifugal fan. According to this implementation, a wind pressure generated by the centrifugal fan is large, so that the jet effect can be more obvious, and the heat dissipation effect can be better.

In a possible implementation, the fan is disposed on a side that is of the PCB and that is far away from the ferrite; the wireless charging device further includes a guide plate, and the guide plate is disposed between the first air guiding opening and the PCB; the first air guiding opening, the fan, the second air guiding opening, and space surrounded by the guide plate form the air duct; a third air guiding opening is disposed on the first surface, and the third air guiding opening leads to the space surrounded by the guide plate; and the third air guiding opening and the gap form a part of the air duct; or the third air guiding opening and the gap form the auxiliary air duct of the air duct. According to this implementation, the air duct is established by using the guide plate, so that air passes through the PCB to dissipate heat of the PCB; and in addition, because the third air guiding opening is disposed on the first surface, and the third air guiding opening leads to the space surrounded by the guide plate, the guide plate generates a jet effect, and because of a diversion disturbance formed due to a jet differential pressure, an airflow passes through the gap between the to-be-charged device and the fast surface to enter the space surrounded by the guide plate through the third air guiding opening. Therefore, convection heat transfer of the to-be-charged device is enhanced, so that the entire to-be-charged device is in a forced convection heat transfer scenario.

In a possible implementation, the second air guiding opening and the third air guiding opening are air inlets, and the first air guiding opening is an air outlet. According to this implementation, the airflow can pass through the to-be-charged device and a device that generates heat and that is inside the wireless charging device.

In a possible implementation, a diameter of the guide plate gradually decreases in a direction from the PCB to the first air guiding opening. According to this implementation, by using the gradually narrowed guide plate, an air speed can increase, so that the jet effect is more obvious, and a heat dissipation effect is better.

In a possible implementation, there is a groove on the first surface, and a hole is disposed on the groove to serve as the third air guiding opening. According to this implementation, the hole is disposed on the groove to serve as the third air guiding opening, so that a diversion effect may be better.

In a possible implementation, the groove is an annular groove. A hole is disposed in a position that is on a side surface of the annular groove and that is close to the ferrite, to form the third air guiding opening. According to this implementation, the hole is disposed in the position that is on the side surface of the annular groove and that is close to the ferrite, to form the third air guiding opening, so that a wind direction of the air guiding opening can be close to a source of heat inside the wireless charging device, and in addition, a waterproof function can be implemented.

In a possible implementation, the fan is an axial flow fan. According to this implementation, the axial flow fan is used, so that an air volume is large, and heat dissipation is enhanced.

In a possible implementation, the protrusion includes a plurality of spaced-apart slip-proof silicone convex hulls. According to this implementation, stability of placing the to-be-charged device can be ensured, and in addition, the gap between the to-be-charged device and the wireless charging device can be left.

In a possible implementation, a height of the spaced-apart slip-proof silicone convex hull is 0.2 mm to 1 mm. According to this implementation, a charging effect can be considered while a good heat dissipation effect is ensured.

DESCRIPTION OF EMBODIMENTS

The embodiments of the present invention provide a wireless charging device. The wireless charging device includes a housing, an induction coil, a ferrite, a PCB, and a fan. The induction coil is attached to the ferrite, and the ferrite, the PCB, and the fan are accommodated inside the housing. The housing includes a first surface and a second surface, a protrusion is disposed on the first surface, and the protrusion is configured to: support a to-be-charged device, and leave a gap between the to-be-charged device and the first surface when the to-be-charged device is installed on the wireless charging device. The ferrite is disposed close to the first surface. At least one first air guiding opening and at least one second air guiding opening are disposed on the housing. When the fan runs, the first air guiding opening, the fan, and the second air guiding opening form an air duct that passes through the ferrite and the PCB. The gap forms a part of the air duct, or the gap forms an auxiliary air duct of the air duct.

In the embodiments of the present invention, the fan is disposed inside the housing of the wireless charging device, so that the fan can drive air to flow to generate wind. The protrusion is disposed on the first surface of the wireless charging device, and the protrusion is configured to: support the to-be-charged device, and leave the gap between the to-be-charged device and the first surface when the to-be-charged device is installed on the wireless charging device, so that a channel is provided for the wind to flow through the to-be-charged device and the first surface. The ferrite is disposed close to the first surface, so that heat of the ferrite is dissipated when the wind flows through the first surface. The at least one first air guiding opening and the at least one second air guiding opening are disposed on the housing. When the fan runs, the first air guiding opening, the fan, and the second air guiding opening form the air duct that passes through the ferrite and the PCB, so that a source of heat inside the wireless charging device can be dissipated. The gap forms the part of the air duct, or the gap forms the auxiliary air duct of the air duct, so that heat of the to-be-charged device can also be dissipated.

In the embodiments of the present invention, the air duct is designed inside the wireless charging device, so that a cooling airflow passes through a device (for example, the induction coil, the ferrite, and the PCB) that generates heat and that is inside the wireless charging device, and simultaneously passes through the to-be-charged device. Based on this inventive concept, a plurality of possible implementations may be used. The foregoing to-be-charged device may be a mobile phone, a PAD, a watch, a band, or the like. In the following embodiments of the present invention, the mobile phone is generally used as an example for description.

Figure 1:
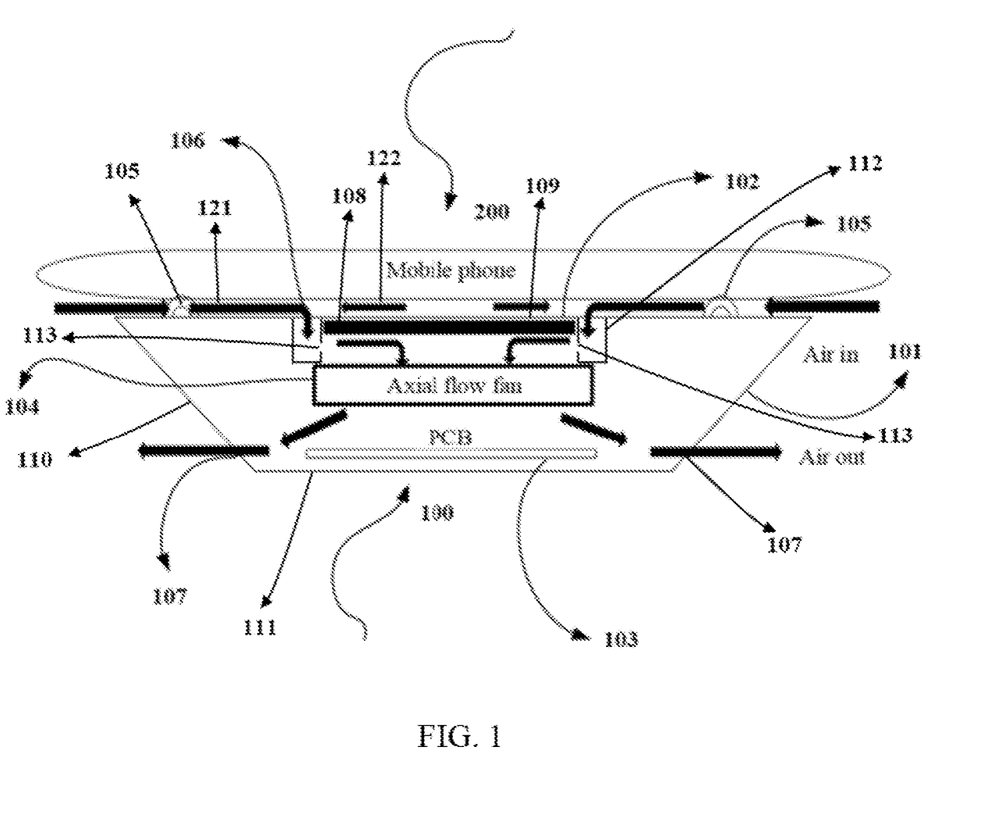
FIG. 1 is a schematic structural diagram of a wireless charging device according to an embodiment of the present invention.

FIG. 1 is a schematic structural diagram of a wireless charging device according to an embodiment of the present invention. The wireless charging device 100 includes a housing 101, an induction coil 108, a ferrite 102, a PCB 103, and a fan 104. The induction coil 108 is attached to an upper surface of the ferrite 102, and the ferrite 102, the PCB 103, and the fan 104 are accommodated inside the housing 101. The housing 101 includes a first surface 109 (an upper surface of the wireless charging device 100), a bottom surface 111 (a bottom surface of the wireless charging device 100), and a second surface 110 (a side surface of the wireless charging device 100), a protrusion 105 is disposed on the first surface, and the protrusion 105 is configured to: support a to-be-charged device (a mobile phone 200), and leave a gap between the to-be-charged device and the first surface when the to-be-charged device is installed on the wireless charging device. The ferrite 102 is disposed close to the first surface 108. At least one first air guiding opening 106 and at least one second air guiding opening 107 are disposed on the housing 101. When the fan 104 runs, the first air guiding opening 106, the fan 104, and the second air guiding opening 107 form an air duct that passes through the ferrite 102 and the PCB 103. The gap forms a part of the air duct, or the gap forms an auxiliary air duct of the air duct. The fan 104 is disposed between the ferrite 102 and the PCB 103. The first air guiding opening 106 is disposed on the first surface 109. The second air guiding opening 107 is disposed on the second surface 110. A first part of the gap 121, the first air guiding opening, the fan, and the second air guiding opening form the air duct. A second part of the gap 122 forms the auxiliary air duct of the air duct.

In this embodiment of the present invention, the fan is in the wireless charging device, and the air duct is designed by using an internal structure that allows air to flow through the to-be-charged device and components inside the charging device that generate heat. In this way, not only the charging device is cooled, but also the to-be-charged device is in a forced convection heat transfer scenario, thereby reducing local hot-spots of the rear cover of the to-be-charged device during wireless charging. Therefore, thermal performance of the entire device is balanced, a heat dissipation capability of the to-be-charged device is greatly improved, current-limiting charging time is delayed, and a wireless charging speed is improved.

Referring to FIG. 1, the first air guiding opening 106 is an air inlet, and the second air guiding opening 107 is an air outlet. It may be understood that the same is applied to a contrary case, to be specific, the second air guiding opening 107 is an air inlet, and the first air guiding opening 106 is an air outlet. According to this implementation, for the to-be-charged device, the wireless charging device may use a forward heat dissipation mode, namely, a suction mode, or may use a reverse heat dissipation mode, namely, a blowing mode. Implementations are flexible and diverse.

In an example, there is a groove 112 on the first surface, and a hole 113 is disposed on the groove to serve as the first air guiding opening. According to this implementation, a suction effect of disposing the hole 113 on the groove 112 to serve as the first air guiding opening may be better when the foregoing suction mode is used.

In an example, the groove is an annular groove. A hole is disposed in a position that is on a side surface of the annular groove and that is close to the ferrite, to form the first air guiding opening. According to this implementation, the hole is disposed in the position that is on the side surface of the annular groove and that is close to the ferrite, to form the first air guiding opening, so that a wind direction of the air guiding opening can be close to a source of heat inside the wireless charging device, and in addition, a waterproof function can be implemented.

Figure 2A:
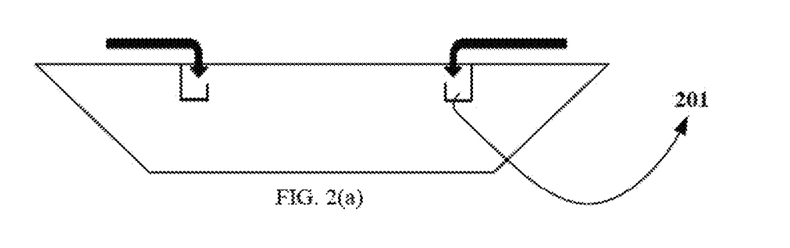
FIG. 2(a) is a possible schematic structural diagram of a waterproof labyrinth.
Figure 2B:
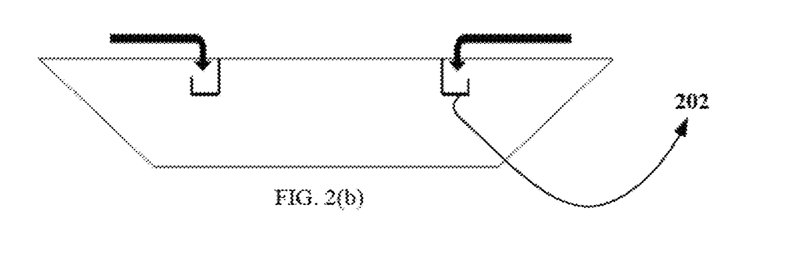
FIG. 2(b) is another possible structural diagram of the waterproof labyrinth.

A waterproof structure of the first air guiding opening may be referred to as a waterproof labyrinth. FIG. 2(*a*) is a possible schematic structural diagram of the waterproof labyrinth. To be specific, the hole (for example, a hole 201) is disposed in the position that is on the side surface of the annular groove and that is close to the ferrite, to form the first air guiding opening. FIG. 2(*b*) is another possible schematic structural diagram of the waterproof labyrinth. To be specific, a hole (for example, a hole 202) is disposed in a position that is on a side surface of the annular groove and that is far away from the ferrite, to form the first air guiding opening.

Figure 3:
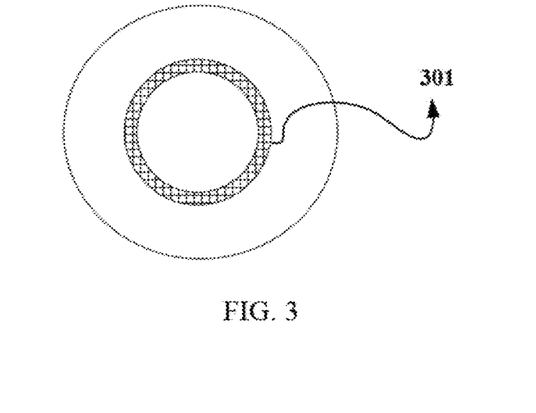
FIG. 3 is a top view of a wireless charging device according to an embodiment of the present invention.

In an example, an annular dust filter may be disposed above the annular groove. FIG. 3 is a top view of the wireless charging device according to this embodiment of the present invention. The top view shows a possible structure of the annular dust filter. In FIG. 3, the annular dust filter 301 is a ring shape with dense holes, which is placed on a front facet of the wireless charging device for air entering.

In this embodiment of the present invention, the first air guiding opening 106 and the second air guiding opening 107 are disposed in flexible and diverse forms. For example, a circle of openings may be disposed on the side surface of the annular groove to serve as the first air guiding opening 106, or only openings disposed in one or more places on the side surface of the annular groove to serve as the first air guiding opening 106. A circle of openings may be disposed in a lower position on the side surface of the wireless charging device to serve as the second air guiding opening 107, or only openings disposed in one or more places in a lower position on the side surface of the wireless charging device to serve as the second air guiding opening 107.

In this embodiment of the present invention, a quantity of first air guiding openings 106 and a quantity of second air guiding openings 107 are not limited. For example, the quantity of the first air guiding openings 106 is 4, and the quantity of the second air guiding openings 107 is 4; or the quantity of the first air guiding openings 106 is 4, and the quantity of the second air guiding openings 107 is 2; or the quantity of the first air guiding openings 106 is 1, and the quantity of the second air guiding openings 107 is 2; or the quantity of the first air guiding openings 106 is 1, and the quantity of the second air guiding openings 107 is 1.

In an example, the fan is an axial flow fan or a centrifugal fan. FIG. 1 shows only a case in which the fan is the axial flow fan. In practice, the centrifugal fan may be selected. According to this implementation, a type of the fan may be flexibly selected according to a structure of the air duct and the internal structure of the wireless charging device. A characteristic of the axial flow fan is a large air volume, and a characteristic of the centrifugal fan is a relatively small size and a high wind pressure.

In an example, the protrusion has a convex hull structure. The convex hull structure may be a slip-proof silicone convex hull. The protrusion 105 includes a plurality of spaced-apart slip-proof silicone convex hulls. This implementation ensures the stability of placing the to-be-charged device and also leave a gap between the to-be-charged device and the wireless charging device.

In an example, a height of the slip-proof silicone convex hull is 0.2 mm to 1 mm. According to this implementation, good heat dissipation improves charging performance.

In addition, in FIG. 1, the second air guiding opening 107 is disposed at a bottom of the side surface, away from where hands may touch for better user experience.

As shown in FIG. 1, an inner ring on the front facet of the wireless charging device is sunken, the annular dust filter is disposed, the hole is disposed on the side surface of the sunken inner ring, air is extracted from an upper part of the axial flow fan, and air is exhausted from a lower part of the axial flow fan. Because the fan extracts the air, an external airflow enters through the hole of the side surface of the sunken inner ring, and passes through the rear cover of the mobile phone, the induction coil, the ferrite, and the PCB that generate heat. In this way, convection heat transfer between air and the devices that generate heat is enhanced, and finally, heated air is exhausted from the bottom of the side surface of the charging device, and is away from the area of the human hand. There is the gap between the mobile phone and the wireless charging device, and the gap is maintained by using a circle of spaced-apart slip-proof silicone convex hulls that are on the surface of the housing of the wireless charging device.

When the mobile phone is wirelessly charged, the mobile phone is placed on the wireless charging device, and is supported by the slip-proof silicone convex hulls to keep the specific gap between the mobile phone and the wireless charging device. The hole is disposed on the side surface of the sunken inner ring on the front facet of the wireless charging device, and the waterproof labyrinth is disposed to implement a waterproof function. The entire charging device is in the suction mode, and the built-in axial flow fan extracts the air from the top and exhausts the air from the bottom. In this way, the airflow is extracted from outside, and is exhausted from the bottom of the side surface of the charging device after flowing through and cooling the rear cover of the mobile phone, and the ferrite and the coil that generate heat inside the charging device. A waterproof air duct architecture of the wireless charging device in the suction mode can reduce a temperature of the rear cover of the mobile phone to a largest extent while cooling the charging device, that is, simultaneously cools two sides, so that the local hot-spot temperature of the rear cover of the mobile phone is reduced. Therefore, usage experience of a user is ensured, and a charging speed is improved.

It may be understood that, to ensure the good heat dissipation effect, smooth of the entire air duct needs to be ensured, so as to reduce air resistance as much as possible.

Figure 4:
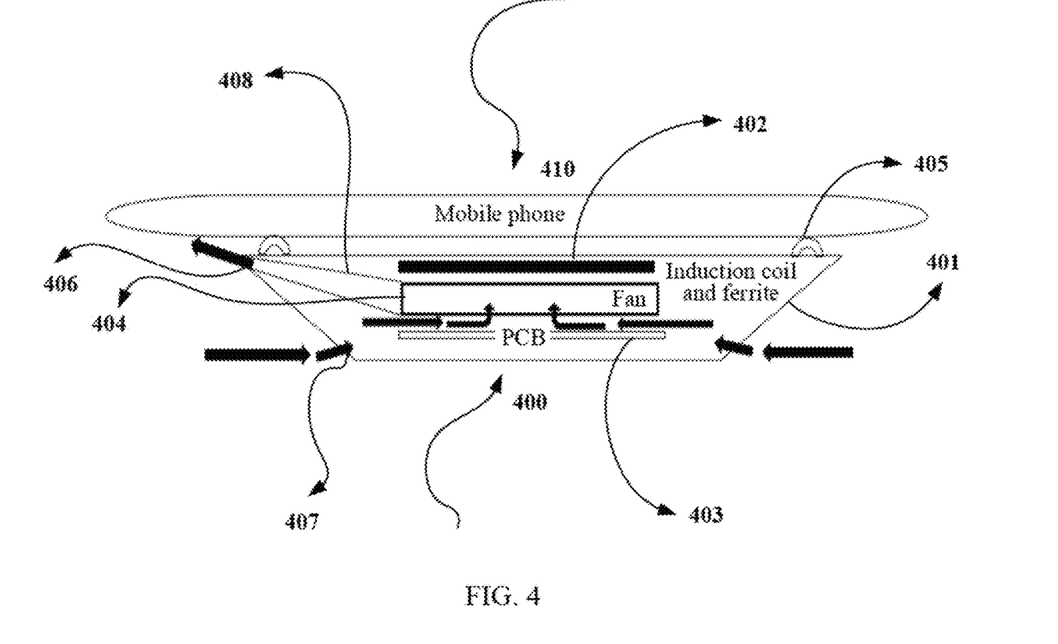
FIG. 4 is a schematic structural diagram of another wireless charging device according to an embodiment of the present invention.

FIG. 4 is a schematic structural diagram of another wireless charging device according to an embodiment of the present invention. The wireless charging device 400 includes a housing 401, an induction coil, a ferrite 402, a PCB 403, and a fan 404. The induction coil is attached to an upper surface of the ferrite 402, and the ferrite 402, the PCB 403, and the fan 404 are accommodated inside the housing 401. The housing 401 includes a first surface (an upper surface of the wireless charging device 400) and a second surface (a side surface of the wireless charging device 400), a protrusion 405 is disposed on the first surface, and the protrusion 405 is configured to: support a to-be-charged device (a mobile phone 410), and leave a gap between the to-be-charged device and the first surface when the to-be-charged device is installed on the wireless charging device. The ferrite 402 is disposed close to the first surface. At least one first air guiding opening 406 and at least one second air guiding opening 407 are disposed on the housing 401. When the fan 404 runs, the first air guiding opening 406, the fan 404, and the second air guiding opening 407 form an air duct that passes through the ferrite 402 and the PCB 403. The gap forms a part of the air duct, or the gap forms an auxiliary air duct of the air duct. The fan 404 is disposed between the ferrite 402 and the PCB 403. The wireless charging device 400 further includes a guide plate 408, and the guide plate 408 is disposed between the first air guiding opening 406 and the fan 404. The first air guiding opening 406, the fan 404, the second air guiding opening 407, and space surrounded by the guide plate 408 form the air duct. The gap forms the auxiliary air duct of the air duct.

In this embodiment of the present invention, the air duct is established by using the guide plate, to lead an airflow to the to-be-charged device, so that forced convection heat transfer is directly performed on a part that is of the to-be-charged device and that generates heat heavily; in addition, the guide plate generates a jet effect, so that the to-be-charged device is cooled by air exhausted by the fan, and is further affected by a diversion disturbance formed due to a jet differential pressure. In this way, convection heat transfer of another part of the to-be-charged device is enhanced, so that the entire to-be-charged device is in a forced convection heat transfer scenario, and a local hot-spot temperature of the to-be-charged device during wireless charging is reduced. Therefore, thermal performance of the entire device is balanced, a heat dissipation capability of the to-be-charged device is greatly improved, current-limiting charging time is delayed, and a wireless charging speed is improved.

In an example, the second air guiding opening is an air inlet, and the first air guiding opening is an air outlet. According to this implementation, the guide plate generates the jet effect by using the first air guiding opening, so that the to-be-charged device is cooled by the air exhausted by the fan, and is further affected by the diversion disturbance formed due to the jet differential pressure. In this way, the convection heat transfer of the another part of the to-be-charged device is enhanced, so that the entire to-be-charged device is in the forced convection heat transfer scenario.

In this embodiment of the present invention, the first air guiding opening 406 and the second air guiding opening 407 are disposed in flexible and diverse forms. For example, a large opening may be disposed on an edge of the first surface to serve as the first air guiding opening 406, and the large opening further includes a plurality of small openings; or only openings disposed in one or more places on the first surface to serve as the first air guiding opening 406. A circle of openings may be disposed in a lower position on the side surface of the wireless charging device to serve as the second air guiding opening 407, or only openings disposed in one or more places in a lower position on the side surface of the wireless charging device to serve as the second air guiding opening 407.

In this embodiment of the present invention, a quantity of first air guiding openings 406 and a quantity of second air guiding openings 407 are not limited. For example, the quantity of the first air guiding openings 406 is 2, and the quantity of the second air guiding openings 407 is 4; or the quantity of the first air guiding openings 406 is 4, and the quantity of the second air guiding openings 407 is 4; or the quantity of the first air guiding openings 406 is 1, and the quantity of the second air guiding openings 407 is 4; or the quantity of the first air guiding openings 406 is 1, and the quantity of the second air guiding openings 407 is 1.

In an example, a diameter of the guide plate gradually decreases in a direction from the fan to the first air guiding opening. According to this implementation, by using the gradually narrowed guide plate, an air speed can increase, so that the jet effect is more obvious, and a heat dissipation effect is better.

In an example, an inclination angle between the guide plate and the first surface is 20° to 40°. According to this implementation, it can be met that air exhausted through the guide plate from the first air guiding opening is directed to the to-be-charged device, and in addition, the jet effect can be more obvious, and the heat dissipation effect can be better.

It may be understood that the inclination angle between the guide plate and the first surface is related to a position of the first air guiding opening. The first air guiding opening may be disposed at an intersection of the first surface and the second surface, or on the edge of the first surface, or on an edge of the second surface. The position of the first air guiding opening may be slightly adjusted by a person skilled in the art according to an actual requirement, and is not limited to a position shown in FIG. 4.

In an example, the fan is a centrifugal fan. According to this implementation, a wind pressure generated by the centrifugal fan is large, so that the jet effect can be more obvious, and the heat dissipation effect can be better.

In an example, the protrusion 405 includes a plurality of spaced-apart slip-proof silicone convex hulls. The implementation ensures stability of placing the to-be-charged device, and in addition, leaves a gap between the to-be-charged device and the wireless charging device.

In an example, a height of the slip-proof silicone convex hull is 0.2 mm to 1 mm. According to this implementation, good heat dissipation improves charging performance.

As shown in FIG. 4, air enters through a hole disposed on a bottom of the side surface of the wireless charging device, and then, the air is extracted from only a lower part of the centrifugal fan, to passes through the induction coil and the ferrite that generate heat, so that air disturbance is enhanced, and convection heat transfer between the air and the devices that generate heat is enhanced; and the air exhausted by the fan is guided by the guide plate that is gradually narrowed in an upward slope direction, and a higher degree of narrowing the guide plate indicates a higher speed of exhausting the air and a better diversion effect of a lower and medium part of the mobile phone. There is the gap between the mobile phone and the wireless charging device, and the gap is maintained by using a circle of spaced-apart slip-proof silicone convex hulls that are on the surface of the housing of the wireless charging device.

When the mobile phone is wirelessly charged, the mobile phone is placed on the wireless charging device, and is supported by the slip-proof silicone convex hulls to keep a specific gap between the mobile phone and the wireless charging device. The air enters from a bottom of the wireless charging device and passes through the induction coil and the ferrite. Then, the air is extracted from the lower part of the centrifugal fan and is exhausted from a side of the centrifugal fan, and then, after being speed up by using the guide plate that is gradually narrowed in the upward slope direction, the air jets out from an upper edge of the wireless charging device to an upper part of a rear cover of the mobile phone (in other words, a position near the local hot spot during charging). According to a jet principle, diversion is formed due to an air differential pressure, and an airflow disturbance is formed at the middle and lower part of the mobile phone based on the diversion, so that convection heat transfer is enhanced. By using the air-cooled wireless charging device, the temperature of the rear cover of the mobile phone is reduced to a largest extent while the temperature of the wireless charging device is reduced, so that the local hot-spot temperature of the rear cover is reduced. Therefore, user experience is ensured, and the charging speed is improved.

It may be understood that the air may be extracted from both an upper part and the lower part of the centrifugal fan. In an example, a manner of extracting the air by the fan may be as follows: The lower part is blocked, and the air is extracted from only the upper part, so that the air duct that passes through the induction coil and the ferrite is formed to cool the induction coil and the ferrite that generate heat, and therefore, a temperature of the surface of the wireless charging device is reduced.

Figure 5:
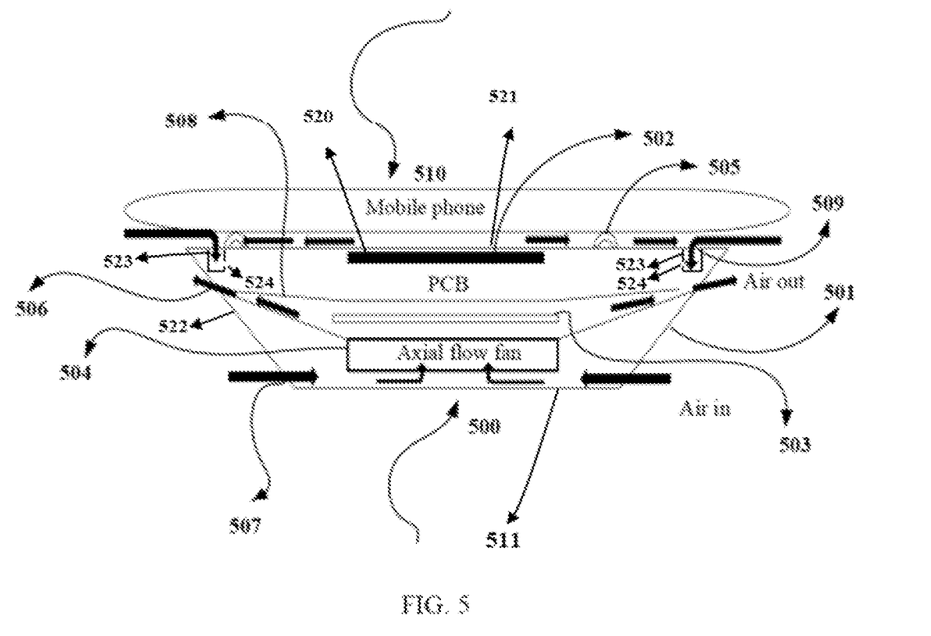
FIG. 5 is a schematic structural diagram of still another wireless charging device according to an embodiment of the present invention.

FIG. 5 is a schematic structural diagram of still another wireless charging device according to an embodiment of the present invention. The wireless charging device 500 includes a housing 501, an induction coil, a ferrite 502, a PCB 503, and a fan 504. The induction coil 520 is attached to an upper surface of the ferrite 502, and the ferrite 502, the PCB 503, and the fan 504 are accommodated inside the housing 501. The housing 501 includes a first surface 521 (an upper surface of the wireless charging device 500), a bottom surface 511 (a bottom surface of the wireless charging device 500), and a second surface 522 (a side surface of the wireless charging device 500), a protrusion 505 is disposed on the first surface, and the protrusion 505 is configured to: support a to-be-charged device (a mobile phone 510), and leave a gap between the to-be-charged device and the first surface when the to-be-charged device is installed on the wireless charging device. The ferrite 502 is disposed close to the first surface. At least one first air guiding opening 506 and at least one second air guiding opening 507 are disposed on the housing 501. When the fan 504 runs, the first air guiding opening 506, the fan 504, and the second air guiding opening 507 form an air duct that passes through the ferrite 502 and the PCB 503. The gap forms a part of the air duct, or the gap forms an auxiliary air duct of the air duct. The fan 504 is disposed on a side of the PCB 503 and the ferrite is disposed on the other side of the PCB 503. The wireless charging device 500 further includes a guide plate 508, and the guide plate 508 is disposed between the first air guiding opening 506 and the PCB 503. The first air guiding opening 506, the fan 504, the second air guiding opening 507, and space surrounded by the guide plate 508 form the air duct. A third air guiding opening 509 is disposed on the first surface, and the third air guiding opening 509 leads to the space surrounded by the guide plate 508. The third air guiding opening 509 and the gap form a part of the air duct. Alternatively, the third air guiding opening 509 and the gap form an auxiliary air duct of the air duct.

In this embodiment of the present invention, the air duct is established by using the guide plate, so that air passes through the PCB to dissipate heat of the PCB. In addition, because the third air guiding opening is disposed on the first surface, and the third air guiding opening leads to the space surrounded by the guide plate, the guide plate generates a jet effect, and because of a diversion disturbance formed due to a jet differential pressure, an airflow passes through the gap between the to-be-charged device and the first surface to enter, through the third air guiding opening, the space surrounded by the guide plate. Therefore, convection heat transfer of the to-be-charged device is enhanced, so that the entire to-be-charged device is in a forced convection heat transfer scenario.

In an example, the second air guiding opening and the third air guiding opening are air inlets, and the first air guiding opening is an air outlet. According to this implementation, the airflow can pass through the to-be-charged device and components inside the wireless charging device that generate heat.

In this embodiment of the present invention, the first air guiding opening 506, the second air guiding opening 507, and the third air guiding opening 509 are disposed in flexible and diverse forms. For example, a circle of openings 524 may be disposed on a side surface of an annular groove 23 to serve as the third air guiding opening 509, or only openings disposed in one or more places on a side surface of an annular groove 523 to serve as the third air guiding opening 509. A circle of openings may be disposed on the side surface of the wireless charging device to serve as the first air guiding opening 506, or only openings disposed in one or more places on the side surface of the wireless charging device to serve as the first air guiding opening 506. A circle of openings may be disposed on the side surface of the wireless charging device to serve as the second air guiding opening 507, or only openings disposed in one or more places on the side surface of the wireless charging device to serve as the second air guiding opening 507.

In this embodiment of the present invention, a quantity of first air guiding openings 506, a quantity of second air guiding openings 507, and a quantity of third air guiding openings 509 are not limited. For example, the quantity of the first air guiding openings 506 is 1, the quantity of the second air guiding openings 507 is 1, and the quantity of the third air guiding openings 509 is 1; or the quantity of the first air guiding openings 506 is 2, the quantity of the second air guiding openings 507 is 2, and the quantity of the third air guiding opening 509 is 4; or the quantity of the first air guiding openings 506 is 1, the quantity of the second air guiding openings 507 is 2, and the quantity of the third air guiding opening 509 is 4; or the quantity of the first air guiding openings 506 is 4, the quantity of the second air guiding openings 507 is 4, and the quantity of the third air guiding opening 509 is 4.

In an example, a diameter of the guide plate gradually decreases in a direction from the PCB to the first air guiding opening. According to this implementation, by using the gradually narrowed guide plate, an air speed can increase, so that the jet effect is more obvious, and a heat dissipation effect is better.

In an example, there is a groove on the first surface, and a hole is disposed on the groove to serve as the third air guiding opening. According to this implementation, the hole is disposed on the groove to serve as the third air guiding opening, so that a diversion effect may be better.

In an example, the groove is an annular groove. A hole is disposed in a position that is on a side surface of the annular groove and that is close to the ferrite, to form the third air guiding opening. According to this implementation, the hole is disposed in the position that is on the side surface of the annular groove and that is close to the ferrite, to form the third air guiding opening, so that a wind direction of the air guiding opening can be close to a source of heat inside the wireless charging device, and in addition, a waterproof function may be implemented. For a structure of the third air guiding opening, refer to FIG. 2 and FIG. 3. Details are not described herein again.

In an example, the fan is an axial flow fan. According to this implementation, the axial flow fan is used, so that an air volume is large, and heat dissipation is enhanced.

In an example, the protrusion 505 includes a plurality of spaced-apart slip-proof silicone convex hulls. According to this implementation, stability of placing the to-be-charged device can be ensured, and in addition, the gap between the to-be-charged device and the wireless charging device can be left.

In an example, a height of the slip-proof silicone convex hull is 0.2 mm to 1 mm. According to this implementation, a charging effect can be considered while a good heat dissipation effect is ensured.

Figure 6:
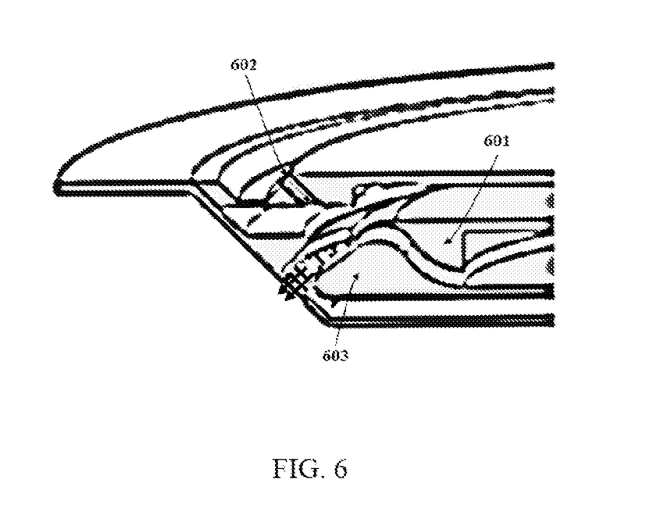
FIG. 6 is a three-dimensional cross-sectional diagram of a wireless charging device according to an embodiment of the present invention.

FIG. 6 is a three-dimensional cross-sectional diagram of a wireless charging device according to an embodiment of the present invention. The wireless charging device shown in FIG. 6 may be the same as the one shown in FIG. 5. As shown in FIG. 6, a guide plate is in positions numbered by 601 and 603, and a third air guiding opening is in a position numbered by 602. An airflow passes out from space surrounded by the guide plate in the positions numbered by 601 and 603. According to a jet principle, the airflow enters through the third air guiding opening in the position numbered by 602, and the airflow passes through a gap between a mobile phone and the wireless charging device, so that a bidirectional heat dissipation effect of the mobile phone and the wireless charging device is achieved.

In this embodiment of the present invention, a material selected for a housing of the wireless charging device may be acrylonitrile butadiene styrene (ABS) plastic, glass, and the like, and an appearance may be in a shape such as a cuboid, a cylinder, or a frustum of a cone.

The foregoing descriptions are merely example implementations of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A wireless charging device, comprising a housing, an induction coil, a ferrite, a printed circuit board (PCB), and a fan; wherein
   the housing comprises a first surface, a second surface and a bottom surface, the second surface connects the first surface and the bottom surface, a protrusion is disposed on the first surface;
   the induction coil is attached to the ferrite, the ferrite is disposed close to the first surface, and the ferrite, the PCB, and the fan are accommodated inside the housing;
   a first air guiding opening and a second air guiding opening are disposed on the housing, the second air guiding opening is located on the second surface and close to the bottom surface;
   the first surface surrounded by the protrusion has an annular groove, and the first air guiding opening is located in the annular groove;
   the protrusion is configured to support a to-be-charged device and allow a gap to be formed between the first surface and the to-be-charged device placed on the wireless charging device, and the fan is configured to extract air from the first air guiding opening and exhaust the air from the second air guiding opening, wherein the gap allows the air drawn by the fan to flow underneath the to-be-charged device to cool the to-be-charged device.

2. The wireless charging device according to claim 1, wherein the first air guiding opening, the fan, and the second air guiding opening form an air duct that let the air pass through the ferrite and the PCB.

3. The wireless charging device according to claim 2, wherein the gap forms a part of the air duct.

4. The wireless charging device according to claim 3, wherein a first part of the gap, the first air guiding opening, the fan, and the second air guiding opening form the air duct, and a second part of the gap forms an auxiliary air duct of the air duct.

5. The wireless charging device according to claim 1, wherein a plurality of first air guiding openings are disposed in the annular groove.

6. The wireless charging device according to claim 1, wherein a plurality of second air guiding opening are disposed on the second surface.

7. The wireless charging device according to claim 1, wherein the fan is an axial flow fan or a centrifugal fan.

8. The wireless charging device according to claim 1, wherein the protrusion has a convex hull structure.

9. The wireless charging device according to claim 8, wherein a height of the convex hull structure is 0.2 mm to 1 mm.

* * * * *